United States Patent [19]

Shirn et al.

[11] 4,021,277

[45] May 3, 1977

[54] METHOD OF FORMING THIN FILM RESISTOR

[75] Inventors: George A. Shirn, Williamstown; William J. Pfister, Cheshire, both of Mass.

[73] Assignee: Sprague Electric Company, North Adams, Mass.

[22] Filed: Dec. 7, 1972

[21] Appl. No.: 313,065

[52] U.S. Cl. .................................. 156/657; 29/620; 156/659; 156/662; 156/663; 204/192 R; 204/298; 338/308; 427/38; 427/102; 427/103; 427/251; 427/294

[51] Int. Cl.² .......................................... C23F 1/02

[58] Field of Search ................ 156/8, 18; 96/36.2, 96/38.4; 117/71 R, 93.1, 93.3, 107.1; 204/192, 298; 338/308; 29/610, 620, 621; 427/38, 39, 47, 102, 103, 251, 252, 258, 282, 294, 383

[56] References Cited
UNITED STATES PATENTS

| | | | |
|---|---|---|---|
| 3,325,258 | 6/1967 | Fottler et al. | 29/183.5 |
| 3,400,066 | 9/1968 | Caswell et al. | 204/192 |
| 3,402,073 | 9/1968 | Pierce et al. | 117/212 |
| 3,669,730 | 6/1972 | Lepselter | 117/200 |
| 3,756,847 | 9/1973 | Leibowitz et al. | 117/93.3 |

Primary Examiner—William A. Powell
Attorney, Agent, or Firm—Connolly and Hutz

[57] ABSTRACT

A process is disclosed for vacuum depositing by co-sputtering a thin film nickel-chromium resistor of metastable composition. Also disclosed is a resistor made by this process, which resistor possesses a near zero temperature coefficient of resistance.

8 Claims, 2 Drawing Figures

METHOD OF FORMING THIN FILM RESISTOR

BACKGROUND OF THE INVENTION

This invention pertains to thin metallic film resistors for use in electronic circuits, and methods for producing such resistors.

Electrical resistors are normally comprised of a relatively low conductivity material, contacted by two metal electrodes and supported by an insulative substrate. A thin film resistor is one in which the resistive material is a film whose thickness usually ranges from a few hundred angstroms to a few thousand angstroms, which material is commonly carbon, metal, or metal oxide.

Of the many methods that can be used for producing thin resistive metallic films, those of evaporation or sputtering in a vacuum are generally preferred over electrolysis or pyrolysis, the latter being prone to leave contaminants in the film which adversely affect the stability and quality of the film product.

Evaporation of metals or metal alloys is accomplished in a vacuum, usually less than one micron, by heating a metal that evaporates and condenses on a nearby substrate. Variations in evaporation technique are mainly related to the method of heating and evaporating the metal, some typical heating methods being by electron beam, laser, resistive heating, radio frequency inductive heating, and flashing a metal coating from a tungsten wire by application of a large step of electrical current through the wire.

Sputtering is the ejection of atoms from the surface of a material by bombardment with energetic particles, which particles are normally positive ions. A common source of ions for sputtering is provided by the well-known phenomenon of glow discharge due to an applied electric field between two electrodes in a gas at low pressures. Another common source of ions for sputtering is the ionization of a low pressure gas by exposure to a high intensity radio frequency (r.f.) electromagnetic field which may be accomplished by the application of an r.f. voltage to electrodes, or r.f. current through a coil in the vacuum chamber. Many practical variations of these two methods of ion production are employed. The sputtered atoms from the ion bombarded material condense on a nearby substrate forming a thin film.

The rate of deposition of atoms on a substrate by sputtering is generally more readily controlled than by evaporation. The sputtered film is also generally more uniform.

The present invention relates particularly to the production of thin resistive films of nickel-chromium alloys. Among other metals and alloys the nickel-chromium alloys have a relatively high bulk resistivity, around $100 \times 10^{-6}$ ohm-cm, and are thus capable of providing higher value resistors in a given space. They also possess a relatively low temperature coefficient of resistance, typically 300 ppm/° C. The alloy known as Nichrome; 60 Ni, 24 Fe, 16 Cr, 0.1C; has been favored for many years as a resistor material. Nickel rich alloys of around 80 Ni and 20 Cr have been used extensively in thin film resistors.

Evaporation methods as opposed to sputtering are usually chosen for the production of nickel chromium resistors due to the relative simplicity of the production equipment, its operation, and maintenance. A large batch of resistors may be deposited by this method having a spread in resistance values of within 10% of the mean. However, the temperature coefficients of these same resistors typically may vary 600 ppm/° C within 95% of the distribution. The center of the distribution will usually lie between 200 ° and 400 ppm/° C depending upon the composition of the evaporating material, the temperature at evaporation, the rate of evaporation, the ultimate film thickness and other factors.

This broad spread of temperature coefficients of resistance within a batch of evaporated thin film resistors, is believed to be attributable in large measure to a broad spread of nickel-chromium compositions. A standard phase diagram for the alloys of nickel and chromium reveals that compositions richer than about 70% nickel and poorer than about 12% nickel are stable single phase alloys at room temperature. They are readily realizable by a variety of noncritical production means, for use at normal room temperature. However, compositions in the middle range are known as metastable and are achieved with difficulty, for use at room temperature, for example by fast quenching such as splat cooling from the liquid state above 1300° C. Slow cooling of such compositions from the liquid state yields a mixture of stable phases. In recent studies it has been found that metastable alloys may also be achieved by codeposit quenching, (See page 202, Thin Film Phenomena by Kasturi L. Chopra, McGraw Hill Book Co. 1969) using either evaporation or sputtering. Sputtering however is greatly preferred, giving more uniform and predictable metastable material. After deposition, the film is annealed at a temperature of about a third of the mean of the melting temperatures of the pure metals. The annealing process yields an irreversible single phase metastable alloy. Much is yet to be learned of the properties of metastable alloys.

Heretofore, when close control of the temperature coefficient of resistance (TCR) is desired, a nickel chromium film can be sputtered yielding a nominal TCR of 150° ± 30 ppm/° C. Furthermore the sputtered film temperature coefficients are not nearly so strong a function of process variables or film thickness as for the evaporated films. See for example "Characterization of Vacuum Evaporated and Sputtered Nickel-Chromium Films" by I. H. Pratt, pp. 215–220, Proceedings of the National Electronics Conference, 1964, Vol. 20.

However, when it is desired to produce nickel chromium resistors having a near zero TCR then the choice must be to sort out the few resistors from a batch of evaporated nickel-chromium resistors that have this characteristic. The effort of sorting and the uncertain but always low yields for such resistors makes them very expensive. The few evaporated resistors that are found to have near zero TCR also are found to be chromium rich and are at least partly composed of metastable nickel-chromium alloy. Heretofore there has been no method to produce such resistors with high yields.

It is therefore an object of this invention to provide a method for making with high yields and low cost, thin film nickel chromium resistors having near zero temperature coefficients of resistance.

SUMMARY OF THE INVENTION

Methods for making a thin film resistor are described. The methods entail co-sputtering chromium and nickel, and alternately stable alloys thereof, such that the deposited film is a metastable alloy composed essentially of ⅔ chromium and ⅓ nickel by weight. Also, resistors are disclosed having been produced by the method of co-sputtering, which resistors possess a near zero temperature coefficient of resistance.

DESCRIPTION OF THE PREFERRED EMBODIMENT

Figure 1:
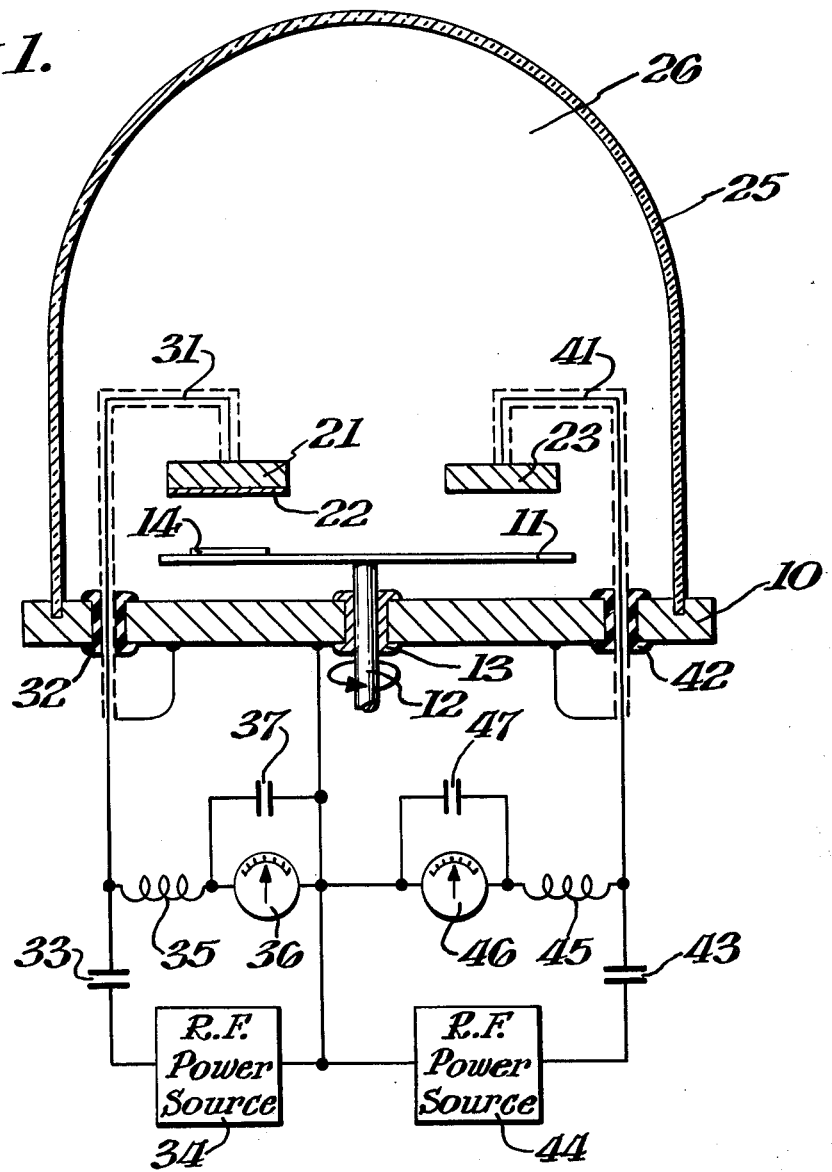
In FIG. 1 is shown a schematic of an r.f. sputtering system that is employed in the preferred embodiment of the method of the present invention.

In FIG. 1 is shown a schematic of a normal sputtering system having a heavy metal baseplate 10 which serves as the support and reference for the other key elements in the system. A turn-table 11 is mounted to a shaft 12, and the shaft 12 is held by a vacuum tight bearing 13 in the baseplate 10. The shaft 12 is driven by a geared down motor (not shown) such that the table rotates. A sample substrate 14 is mounted eccentrically to the top surface of the turntable 11.

A cylindrical copper target 21 having an electrodeposited coating of chromium 22 on its bottom surface is mounted several inches above the turntable 11 with its chromium surface parallel to the turntable and centered such that the rotating substrate 14 passes directly underneath. An 80% nickel 20% chromium alloy cylindrical target 23 is mounted symmetrically with the chromium plated copper target relative to the turntable 11. Thus the turntable can be turned so that the substrate 14 may lie alternately under the chromium plated target 21, the nickel-chromium target 23.

Both targets 21 and 23 are physically supported by electrically insulating materials (not shown). Both targets 21 and 23 contain cavities through which cooling water flows. The cooling water source and return lines are also made of insulating plastic tubing that are connected to water and drain pipes that are fed through and sealed to the base plate 10 (not shown). The just mentioned features of the system are well known and are omitted from the drawing for the sake of clarity.

The chromium plated target 21 is connected by a shielded coaxial cable 31 through a vacuum seal 32 in the base plate 10 and from there through a capacitor 33 to an r.f. power source 34. The r.f. power source 34 is grounded to the base plate 10. Between the target side of the capacitor 33 and ground (base plate 10), is a voltage monitoring circuit comprising an inductor 35 in series with the parallel combination of a d.c. volt meter 36 and a capacitor 37. Similarly the nickel-chromium target 23 is connected by a shielded coaxial cable 41 through a vacuum seal 42 in the base plate 10 and from there through a capacitor 43 to an r.f. power source 44. The r.f. power source 44 is grounded to base plate 10. Between the target side of the capacitor 43 and ground (base plate 10), is a voltage monitoring circuit comprising an inductor 45 in series with the parallel combination of a d.c. volt meter 46 and a capacitor 37.

The r.f. driving and the monitoring circuit associated with the chromium plated target 21 is seen to be identical to the circuit associated with the nickel-chromium target 23. The components employed in these two circuits are also essentially identical so that the two circuits are the same in all respects. Consider for example the circuit associated with the chromium plated target 21. With a low pressure argon gas in the vacuum region 26, and with r.f. power source 34 turned on, the r.f. field ionizes the gas in the vicinity of the target 21. When the frequency of the r.f. energy is greater than about 1.0 MHz, the ions having less mobility than the lighter free electrons, do not reach the target in as large a quantity during the half cycle when the target is negative, as do the electrons during the positive half cycle. At 10.0 MHz this difference becomes very great and when the target has d.c. isolation from ground potential, as it does when connected to the r.f. source through capacitor 33, then the target acquires a large negative potential. Volt meters 36 and 46 monitor the d.c. voltages thus acquired on the chromium plated target 21 and the nickel-chromium target 23 respectively. Inductors 35 and 45 act to filter out the r.f. energy from the meters while capacitors 37 and 47 shunt away r.f. energy from the meters.

A glass bell jar 25 is sealed to the base plate 10 and a vacuum created in the region 26 thus encompassed. The vacuum pump and necessary access through the base plate 10 are not shown. Also not shown is means by which argon gas may be admitted to the vacuum region 26 through the base plate 10.

A preferred embodiment of the method of this invention, employing a sputtering system such as shown in FIG. 1, is described as follows:

A clean substrate is mounted on the turntable with a surface facing the targets. It may be prevented from sliding by mechanical stops fastened to the turntable.

With the bell jar in position, as shown in FIG. 1, a vacuum of about $10^{-5}$ torr is drawn, and argon gas is leaked into the jar so as to achieve a gas pressure of about 1 torr. A normal step for purging the surfaces of the targets is achieved by positioning the turntable so that the substrate is not under either target and applying r.f. voltage to the targets, thus sputtering away the oxides and other contaminants from the target surfaces. This takes only a few minutes. The turntable motor is turned on, causing the substrate to move alternately under the two targets. The sputtering rate from each target is individually controlled by adjusting the associated r.f. power supply level. A first approximation of the ratio of d.c. voltages required at the two targets may be calculated for a sputtered film of any given composition. Ultimately the precise composition of the film must be determined by an analysis of the film by, for example, mass-spectrometry. When the desired composition has once been achieved, it may readily be duplicated by sputtering under the same conditions again. Thus, for this preferred method this adjustment is made such that the composition of the deposited film is essentially ⅔ chromium and ⅓ nickel by weight.

The rate of rotation of the turntable is set such that during one pass under each target the substrate receives substantially less than an atomic layer of sputtered material. The final thickness of the sputtered film is proportional to the sputtering time.

The freshly sputtered resistors are then annealed. This step is accomplished by heating the resistors in air to about 450° C for 5 minutes, and allowing them to return to room temperature.

Figure 2:
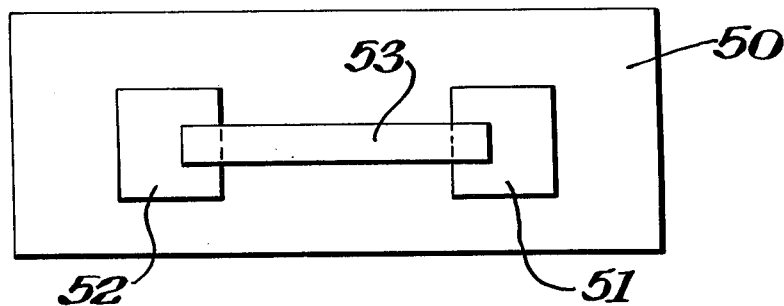
In FIG. 2 is shown a resistor constructed according to a preferred embodiment of the present invention.

A preferred embodiment of a resistor according to the present invention is represented in FIG. 2. The substrate 50 upon which a thin film resistor is formed may be glass, glazed alumina, or the oxidized surface of a silicon crystal slice. Two aluminum film islands 51 and 52, having been deposited by evaporation on the substrate, constitute the two electrical contacts of the resistor. A thin metastable alloy film strip, composed of 66% chromium and 34% nickel, having been sputtered by the preferred method described above through an aperture in a photo-resist mask, lies adjacent the surface of the substrate and overlaps the two aluminum contacts 51 and 52 at distal ends. The mask is then removed chemically and the portions of resistor film that were supported by the mask fall away. The aluminum contacts may be formed by a normal process of aluminum deposition by vacuum evaporation, photoresist masking and etching.

The geometry of the resistor film may alternatively be determined by such means as forming a photo-resist mask only over the sputtered resistor film area that is to be retained, and etching away the exposed resistor film.

It should also be recognized that the metal film electrodes, forming the resistor contacts, may be deposited on the substrate prior to sputtering or may be deposited to the resistor film and substrate after sputtering.

Several groups of experimental resistors were made by the described method of the preferred embodiment. The sputtering rates were so adjusted that the deposited film had a composition of about ⅔ chromium and ⅓ nickel by weight, this ratio having been previously determined experimentally to yield resistor films having a near zero temperature coefficient of resistance.

This group of resistors was produced in a vacuum system comprising a 50 cfm forepump, a 10 inch diffusion pump and an 18 inch by 12 inch high cylindrical belljar operating at about 5 microns of argon pressure. The argon flowed at a through-put of about 5 torr liters per second. The two 5 inch diameter water cooled targets were mounted 9 ¼ inches between centers. The chromium plated target (21 in FIG. 1) was copper with 0.003 inches of electroplated chromium (22). The other target was 80% Ni 20% Cr.

The substrates were oxidized silicon for some resistors and glazed alumina for others. Two aluminum electrodes were evaporated onto the substrate forming the contacts. The substrates were mounted on the turntable 1 ⅛ inches from the target. The turntable rotated at 48 rpm. The r.f. power sources operated at 13.6 MHz and were adjusted to give 2000 volts d.c. on the chromium target and 1000 volts d.c. on the nickel-chromium target. Sputtering time was 3 minutes. The resistors were then heated in air at 450° C for 5 minutes.

The resulting resistor films had a sheet resistivity of about 220 ohms per square, a thickness of 83 A, and a composition of 66.0 ± 0.7 weight % chromium and 34.0 ± 1.1 weight % nickel. The mean TCR was −4.0 ppm, and all resistors were within ±20 ppm/° C of zero TCR.

Co-sputtering can be accomplished in a variety of ways in addition to the particular method described as preferred herein. For example, a pure chromium target and a pure nickel target may be used. Another method would employ a single target whose sputtered surfaces partly consist of nickel and partly of chromium.

It is common practice to anneal thin film resistors, however deposited. The annealing step usually changes the TCR as well as the resistivity of the film. Sputtered and evaporated thin metal films are substantially amorphous where after annealing they become crystalline and their electrical properties become relatively stable and having no retrace over a temperature range having an upper limit of about the temperature of anneal. The temperature of anneal therefore should be higher than the maximum expected operating temperature.

Resistors made according to the principles of this invention may be made as discrete individual resistors or in multiples on the same substrate. Further, since an oxidized silicon surface has been shown to work satisfactorily as a substrate material, and since the substrate temperature in the sputtering operation need not increase but a few degrees, the method of this invention is obviously compatible with and is in no way deleterious to a silicon integrated circuit on which it is desired to deposit low TCR thin film resistors.

In retrospect, it is believed that the few evaporated resistors having near zero temperature coefficients of resistance, which resistors were sorted out of a large batch of evaporated nickel-chromium resistors, are metastable compositions physically indistinguishable from those made by the sputtering method of this invention. Resistors produced according to the principles of this invention are therefore distinguished as being uniform in quality and having low cost.

What is claimed is:

1. A method of forming a thin resistor film comprising, depositing by co-sputtering a metastable alloy film on a substrate, said sputtering being accomplished by the simultaneous sputtering of chromium and nickel, the ratio of the sputtering rates of chromium and nickel being adjusted such that the sputtered resistor film composition is substantially ⅔ chromium and ⅓ nickel by weight, annealing said resistor film, determining the geometry of said film by a normal photo-etch process, and providing electrical contacts at distal surface regions of said resistor film.

2. The method of claim 1 wherein said co-sputtering is accomplished by sputtering from two targets having different compositions.

3. The method of claim 1 wherein said substrate is comprised of a silicon body and a layer of silicon oxide covering at least a portion of said body, and said resistor film is deposited on said oxide layer.

4. The method of claim 1 wherein said contacts are formed by vacuum depositing spaced first and second metal electrodes, such that at least a portion of each of said electrodes lies in contact with a portion of said resistor film.

5. The method of claim 1 wherein the geometry of said resistor film is determined by forming by a normal process a photo resist mask having an aperture, and sputtering said resistor film onto said mask and onto said substrate thrugh said aperture, and chemically removing said mask.

6. The method of claim 1 wherein the geometry of said resistor film is determined by forming by a normal process a photo resist mask over a portion of said resistor film, chemically etching away exposed portions of said resistor film and chemically removing said mask.

7. The method of claim 2 wherein said compositions of said two targets are chromium and an alloy composed essentially of 80% nickel and 20% chromium, respectively, said simultaneous sputtering being accomplished by alternately moving said substrate under each of said two targets.

8. The method of claim 7 wherein during each pass of said moving substrate under each of said targets, said substrate receives substantially less than one atomic layer of sputtered material.

* * * * *

UNITED STATES PATENT OFFICE
CERTIFICATE OF CORRECTION

Patent No. 4,021,277     Dated May 3, 1977

Inventor(s) George A. Shirn et al

It is certified that error appears in the above-identified patent and that said Letters Patent are hereby corrected as shown below:

Cover page, under "[56] References Cited", the following U.S. patent should be listed:

-- 3,528,906     9/1970     Cash, Jr. et al....204/298 --

Column 2, line 5, "200° and 400 ppm/°C" should read

-- 200 and 400 ppm/°C --

Column 2, line 40, "150° $\pm$ 30 ppm/°C" should read

-- 150 $\pm$ 30 ppm/°C --

Column 2, line 67, "and" should read -- or --

Claim 5, line 5, (Column 6, line 51) "thrugh" should read

-- through --

Signed and Sealed this fifth Day of July 1977

[SEAL]

Attest:

RUTH C. MASON
*Attesting Officer*

C. MARSHALL DANN
*Commissioner of Patents and Trademarks*